United States Patent
Barnett et al.

(10) Patent No.: US 6,510,606 B2
(45) Date of Patent: *Jan. 28, 2003

(54) MULTICHIP MODULE

(75) Inventors: David M. Barnett, Littleton; Don J. Thielman, Bailey, both of CO (US)

(73) Assignee: Lockheed Martin Corporation, Bethesda, MD (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,415

(22) Filed: Jun. 15, 1998

(65) Prior Publication Data

US 2002/0011354 A1 Jan. 31, 2002

(51) Int. Cl.[7] .................................................. H05K 3/34
(52) U.S. Cl. ........................................... 29/840; 29/832
(58) Field of Search ................................. 174/52.1, 254, 174/68.5; 257/690, 701, 702, 709; 439/67, 71, 68, 77; 29/840, 825, 832, 834

(56) References Cited

U.S. PATENT DOCUMENTS

| | | | | |
|---|---|---|---|---|
| 3,614,832 A | | 10/1971 | Chance et al. ................. 29/626 |
| 3,996,603 A | * | 12/1976 | Smith ........................... 357/80 |
| 4,246,697 A | | 1/1981 | Smith ........................... 29/827 |
| 4,372,037 A | | 2/1983 | Scapple et al. ................ 29/613 |
| 4,472,876 A | | 9/1984 | Nelson ......................... 29/840 |
| 4,517,051 A | * | 5/1985 | Gazdik et al. ................ 156/644 |
| 4,744,009 A | * | 5/1988 | Grabbe et al. ................ 361/398 |
| 4,918,811 A | * | 4/1990 | Eichelberger et al. ......... 29/840 |
| 4,941,255 A | * | 7/1990 | Bull .............................. 29/833 |
| 5,102,831 A | * | 4/1992 | Haga ............................. 437/220 |
| 5,111,278 A | | 5/1992 | Eichelberger ................. 357/75 |
| 5,147,210 A | * | 9/1992 | Patterson et al. .............. 439/91 |
| 5,151,388 A | | 9/1992 | Bakhit et al. ................. 437/209 |
| 5,159,751 A | * | 11/1992 | Cottingham et al. .......... 29/832 |
| 5,162,613 A | * | 11/1992 | Schoenthaler ................. 174/88 |
| 5,198,824 A | | 3/1993 | Poradish ..................... 343/700 MS |
| 5,205,741 A | * | 4/1993 | Steen et al. ................... 439/70 |
| 5,216,806 A | | 6/1993 | Lam ............................. 29/848 |
| 5,219,377 A | * | 6/1993 | Poradish ...................... 29/830 |
| 5,237,204 A | | 8/1993 | Val ............................... 257/698 |
| 5,241,450 A | | 8/1993 | Bernhardt et al. ........... 361/689 |
| 5,241,454 A | * | 8/1993 | Ameen et al. ............... 361/744 |
| 5,250,843 A | | 10/1993 | Eichelberger ................ 257/692 |
| 5,373,627 A | * | 12/1994 | Grebe ........................... 29/841 |
| 5,384,691 A | * | 1/1995 | Neugebauer et al. ........ 361/794 |
| 5,412,539 A | * | 5/1995 | Elwell et al. ................. 361/792 |

(List continued on next page.)

OTHER PUBLICATIONS

Coors Electronic Package Company, "Design Guide" Copyright 1995.*

Primary Examiner—Carl J. Arbes
Assistant Examiner—Sean Smith
(74) Attorney, Agent, or Firm—Marsh Fischmann & Breyfogle LLP

(57) ABSTRACT

Low temperature co-fired ceramic (LTCC) multichip modules are used to provide high density interconnects between electronic elements. A ceramic carrier includes a number of cavities which are sized to receive a variety of submodules. The submodules are constructed to hold a variety of circuit elements, such as circuit dice and provide the conduction paths for establishing interconnections between these chips. These circuit elements are attached on one side of the submodule and electrical contacts are provided on the opposite side. Upon installation into the cavity in the carrier module, the submodule is flipped such that the electrical connections are exposed. Once in the cavity, a layer of flex circuitry is applied over the submodule and the ceramic carrier in order to establish electrical connection between electrical elements in the submodules as well as components external to the ceramic carrier.

8 Claims, 5 Drawing Sheets

U.S. PATENT DOCUMENTS

| | | | |
|---|---|---|---|
| 5,432,676 A | * 7/1995 | Satoh et al. | 361/752 |
| 5,461,196 A | 10/1995 | Virga et al. | 174/52.4 |
| 5,506,383 A | 4/1996 | Chen | 219/85.22 |
| 5,529,441 A | * 6/1996 | Kosmowski | 408/1 R |
| 5,544,017 A | * 8/1996 | Beilin et al. | 361/790 |
| 5,564,181 A | 10/1996 | Dineen et al. | 29/841 |
| 5,568,682 A | 10/1996 | Gates, Jr. et al. | 29/831 |
| 5,742,484 A | * 4/1998 | Gillette et al. | 361/789 |
| 5,757,073 A | * 5/1998 | Hoffmeyer | 257/700 |
| 5,930,117 A | * 7/1999 | Gengel | 361/720 |
| 6,118,665 A | * 9/2000 | Kishida et al. | 361/749 |

* cited by examiner

MULTICHIP MODULE

FIELD OF THE INVENTION

The present invention relates to multichip module assemblies and more particularly to high-density interconnect multichip modules.

BACKGROUND OF THE INVENTION

Many types of electronic devices employ a number of integrated circuit chips which are interconnected to one another and assembled in a single package or module. Integrated circuits are currently being constructed employing various forms of multichip module (MCM) technology. A multichip module is a chip carrier on which various chips are located and on which the chip terminals are fed out by various means to remotely located connections. Most commonly, these multichip modules are incorporated in multi-layer dielectric substrates that employ thin film processes for forming electrically conductive traces to interconnect the various chips. The multi-layer dielectric substrates are made employing techniques that have been initially developed for various types of semiconductor processing. These MCM's may include high density interconnect (HDI) technology. In an MCM, many chips may be connected in close proximity to each other.

A different, less costly technology, called low temperature co-fired ceramic (LTCC) has been developed for forming the multi-layer interconnecting circuits for multi-layer electronic packages. LTCC technology employs multiple layers of ceramic tape processed by thick film techniques to provide conductive circuit traces and interconnections extending between the many layers of the LTCC module. The LTCC module is capable of high volume, low cost manufacturing.

SUMMARY OF THE INVENTION

Described herein is a multichip module. The multichip module includes a carrier module with at least one cavity formed therein. Positioned within the cavity is at least one submodule assembly which includes at least one electronic element mounted thereon. Covering both the carrier module and the submodule is a layer of flex circuitry which establishes electrical contact with the submodule assembly and provides for the transmission of signals. The layer of flex circuitry is removable in order that the submodule assembly may be removed from the cavity, inspected and replaced.

In one aspect of the invention the submodule assembly is constructed from low temperature co-fired ceramic (LTCC). The LTCC submodule assembly includes at least one electronic component mounted thereon. The electronic component may be any type of integrated circuit chip, for example, a signal processing chip or a microwave chip, or it may be a single electronic component such as a capacitor or a resistor. In lieu of mounting a hard component on the submodule assembly, single components such as capacitors or resistors can be silk screened onto an exterior surface.

The submodule assembly is constructed from multiple layers of an unfired ceramic tape. Before construction begins, it is first determined which electrical components will be mounted on the submodule and what sort of electrical connections are needed. Once this is known, an electric circuit is designed to provide the appropriate electrical connections and silk screens are prepared to apply the circuit to the tape layers. Before the silkscreens are applied, vias are punched through some or all of the layers at locations where electrical connections between layers will be created. The silk screens, which may include a refractory metal paste, may be then applied to the layers to establish the conduction paths. The application of the silk screen also metallizes the vias which provide vertical conduction paths between layers. In the design of the circuit, as many layers as necessary can be used in order to complete the desired circuit.

The ceramic layers have the characteristic of providing electrical insulation between conduction lines which may pass in close proximity to each other on the different layers. Further, an entire layer of the ceramic tape may be metallized in order to create a power source or a ground plane. During the creation of the ceramic tape layers, connection pads are also silk screened onto what will be the exterior surfaces of the submodule assembly. These connection pads will provide electrical connection between elements mounted on the submodule assembly as well as to devices located remote therefrom.

Once all the circuitry has been applied to the individual layers, the entire structure is either held together in a vise type device, or the layers are laminated. The stack of ceramic tape layers is then fired in an oven at a predetermined temperature. At this point the layers of the submodule assembly become a single structure. Once the firing process is complete, the external pads are plated with a conductive metal in order to establish a good electrical connection with elements connected at these points.

Once the above-described processes are complete, the electronic components may be mounted on the submodule assembly. This may be done through at least two different methods. In the first aspect of the invention, the electrical components are mounted on the submodule substrate through establishing wire bond connections between connection pads on the electronic components, and the connection pads which were silk screened on the submodule assembly. In order to install the circuit dice, these elements are aligned so that the connection pad on both elements are in close proximity to each other. In another aspect of the invention, the circuit dice are surface mount assembly (SMA) devices with external connection pads which can be directly soldered to the connection pads on the submodule assembly. In yet another aspect of the invention, individual components such as capacitors or resistors can be silk screened on the submodule assembly such that the resulting components are in electrical contact with the connection pads.

As an alternative to the co-fired ceramics other multichip module assembly technologies may be used in the construction of the submodule assembly. They include MCM-L where the submodules are constructed of plastic laminate-based dielectrics and copper conductors and MCM-D where the submodules are formed by deposition of thin film metals and dielectrics, which may be polymers or inorganic dielectrics.

With construction of the submodule assembly completed, the carrier module is provided for installation. In one aspect of the invention the carrier module may have a cavity formed therein for receiving the submodule assembly. Before installation on to the carrier module, the submodule assembly is flipped such that the electric components mounted on one surface of the submodule assembly are completely enclosed in the cavity. On the opposite side of the submodule assembly connection pads are exposed. Once in the cavity, a layer of flex circuitry is applied over the carrier module and the submodule assembly in order to establish electrical connections.

In one aspect of the invention, the flex circuitry is a combination of an insulative material and a metallization layer. To begin the application process, a layer of insulative material is dispersed over the submodule assembly and the carrier module. In one embodiment of the invention, this insulative material is polyimide. After this layer has been disposed, holes are created in the insulative layer exposing the connection pads on the submodule assembly. A metallization layer is then applied over the entire layer of the plastic insulative material. Application of this metallization layer metallizes the formed holes establishing electrical contact with the exposed connection pads. A circuit has been designed in order to provide the desired electrical connections between the submodule assembly and other electronic components. This circuit is masked off on the metallization layer. The unwanted metallization is etched away, leaving the circuit. In one aspect of the invention, multiple layers of the insulative material and the metallization layer can be applied to create a complex circuit. The insulative material provides electrical insulation between conduction paths which may be in close proximity to each other. In yet another aspect of the invention, the metallization layer may also remain unetched to create a ground plane or be used as part of a power source.

In the event that one of the submodule assemblies needs to be removed, the layer of flex circuitry can be peeled back from the carrier module exposing the submodule assembly. At this point the submodule assembly may be removed, inspected, tested or otherwise disposed of. A new submodule assembly may be then installed and the electrical connections reestablished.

DESCRIPTION OF THE PREFERRED EMBODIMENTS

Figure 1:
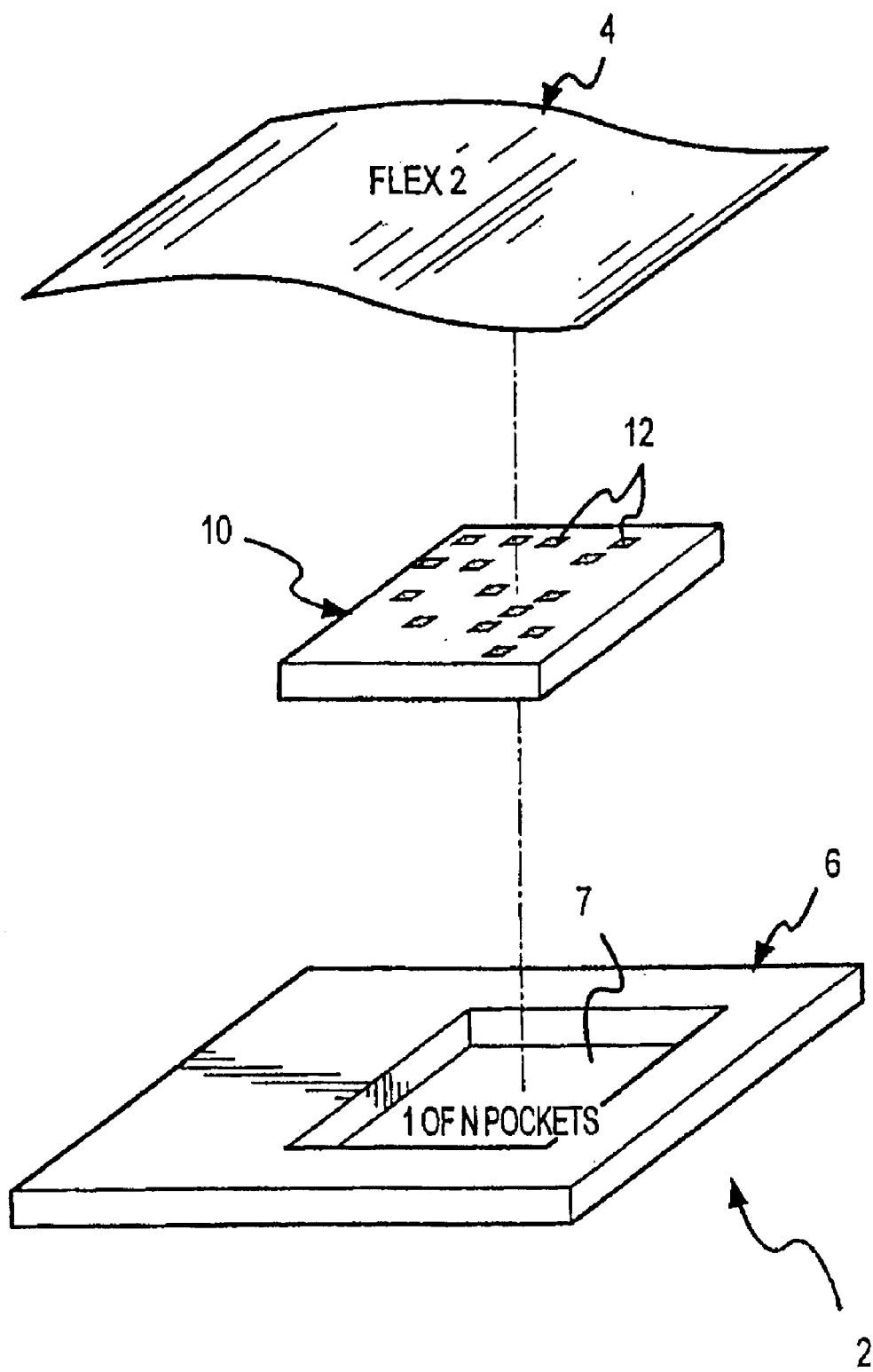
FIG. 1 is an exploded view of the low temperature co-fired ceramic multichip module.

Disclosed in FIG. 1 is an exploded view of the multichip module 2. This module includes a ceramic carrier 6 which includes at least one integrated cavity 7 which receives submodule assembly 10. The submodule assembly 10 includes a number of electrical connection pads 12 which provide for the transmission of signals to and from electrical components mounted on the submodule assembly. The flex circuitry 4, which is disposed over the submodule assembly and the carrier module, includes conduction paths which provide electrical connections between the connection pads 12 on the submodule assembly and other devices included in the ceramic carrier, or located remote therefrom.

Figure 2:
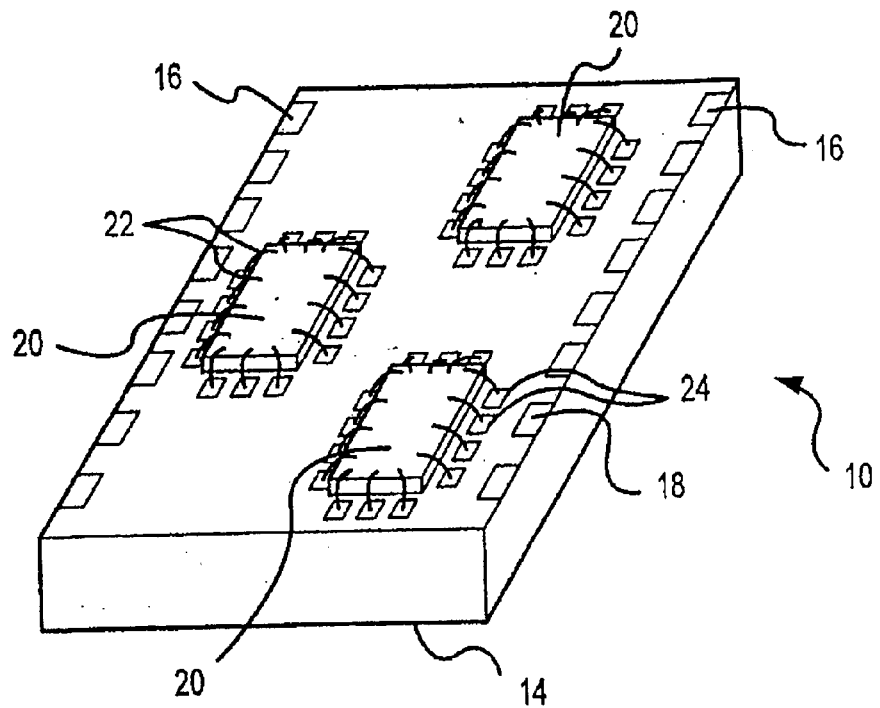
FIG. 2 is a view of the integrated circuit dice wire bonded to the submodule assembly.

FIG. 2 shows in detail components included as part of submodule assembly 10. In one aspect of the invention the submodule assembly is created from low temperature co-fired ceramic (LTCC). Mounted on the submodule assembly are one or more integrated circuit dice 20. The circuit dice 20 may represent a number of different electrical components. They include any sort of integrated signal processing or microwave chip, or they may be a single component such as a capacitor or resistor. In another aspect of the invention, the electrical components may be silk screened onto the upper surface of the submodule assembly. These components may be either a resistor, capacitor or other device of simple construction.

In the configuration shown in FIG. 2, the circuit dice 20 are wire bonded to connection pads 24 on the submodule 14. These wire bonds provide a means for the transfer of electrical signals between the circuit dice to the conduction paths incorporated into the submodule assembly. These wire bonds are thin strands of wire which are bonded using one of several different methods to both the circuit dice and the connection pads. Also included on the submodule are test/interconnection pads 18. These pads are in contact with the circuitry incorporated into the submodule assembly and may be used for establishing electrical connections with other submodules or providing for the testing of components mounted on the submodule assembly.

Figure 3:
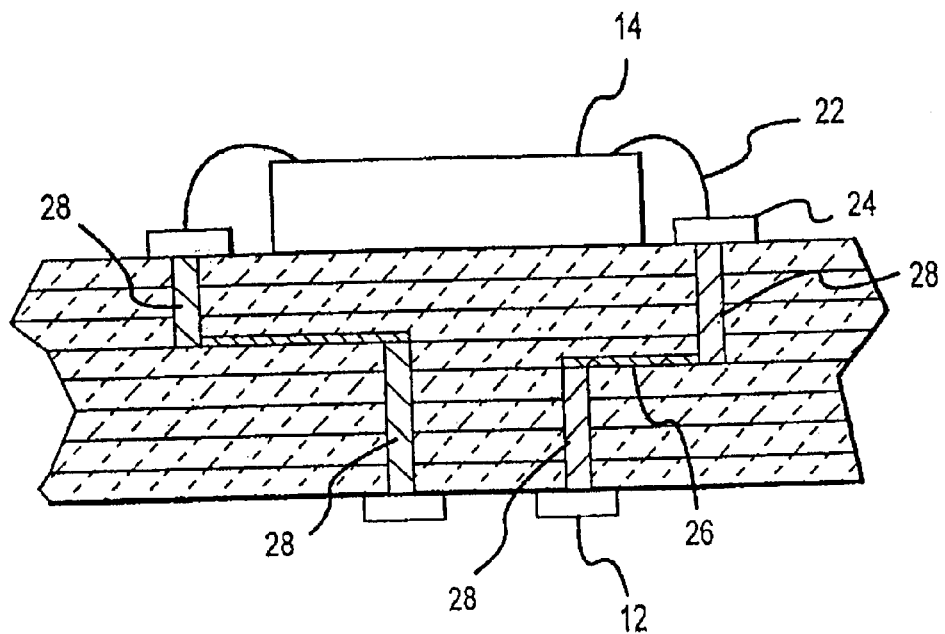
FIG. 3 is a side view of the layers of the submodule substrate showing the conduction lines, vias, and connection pads wire bonded to the circuit dice.

FIG. 3 discloses a cross-sectional view of the submodule assembly 10 with the circuit dice 14 mounted thereon. The wire bonds 22 electrically connect the component pads to connection pads 24. In this cross-sectional view, it is clearly seen that the submodule is made up of many layers. Within the layers, are conduction paths 26 and vias 28. The vias and conduction paths are incorporated into the submodule assembly such that electric signals can be transmitted between circuit dice mounted on the submodule, as well as to connection pads 12. The conduction paths are very thin layers of fired metal inks which have been silkscreened on to individual layers of the submodule assembly. The vias are holes that have been punched through the layers of the submodule assembly and then metallized to provide an electrical connection between layers. The construction of the submodule assembly will be described in greater detail below.

In constructing the submodule assembly, multiple layers of an unfired ceramic tape are necessary. The ceramic tape can be alumina, aluminum nitride, or any similar material. The number of layers used in creating the submodule assembly is dependent on the number and type of electrical connections and conduction paths which will be incorporated therein. Before any work begins on the ceramic tape layers, an electrical circuit is designed which provides the necessary interconnections between circuit dice, as well as to the connection pads. Conduction paths are also provided to test interconnection pads 18. Multiple layers of the ceramic tape may be necessary in order to provide adequate insulation between conduction lines, power planes, and ground planes which are located on different layers of the submodule assembly.

Once these circuits are designed, silk screens which include the conduction lines as well as the location for the vias be punched through the ceramic layers are prepared. The conduction lines may be made from a refractory metal paste applied to the layers. Before the silk screens are applied, the vias are punched through the appropriate ceramic layers. After the creation of the vias, the silk screens are applied. Through the application of these silk screens, the vias are metallized. As part of the silkscreening process, connection pads 24 and 12 are applied to the appropriate layers.

Once all the conduction paths and connection pads have been applied and all the vias have been metallized, the "green state" ceramic layers are aligned in a stack. These layers may be held together in a vice type device or laminated. The entire structure is then fired in an oven at a predetermined temperature. While in the oven, the organic binder is burned off and the many layers become a single structure. Once the firing is complete, the connection pads 12 and 24 are plated with the appropriate metallic material so that a good electrical connection may be established. These connection pads serve the purpose of providing electrical connections between devices mounted on the submodule assembly or to devices external from the submodule assembly.

As an alternative to the co-fired ceramics, at least two other technologies may be used in the construction of the submodule assembly. They include MCM-L where the submodules are constructed of plastic laminate-based dielectrics and copper conductors, and MCM-D where the submodules are formed by deposition of thin film metals and dielectrics, which may be polymers or inorganic dielectrics. One skilled in the art would realize that a number of methods may exist for constructing the submodule assembly which are within the scope of the invention described herein.

Once construction is completed for the layers of the submodule assembly, the circuit dice may be mounted thereon. Referring again to FIG. 2, the connection pads 24, and the circuit dice must first be properly aligned. In the embodiment of the invention where wire bond connections are established between the circuit dice and the submodule assembly, the circuit dice is first positioned on the submodule in a desired position relative to these connection pads. Once this positioning is completed, the wire bonds are bonded to the desired terminal on the integrated circuit dice and the desired connection pad.

Figure 8:
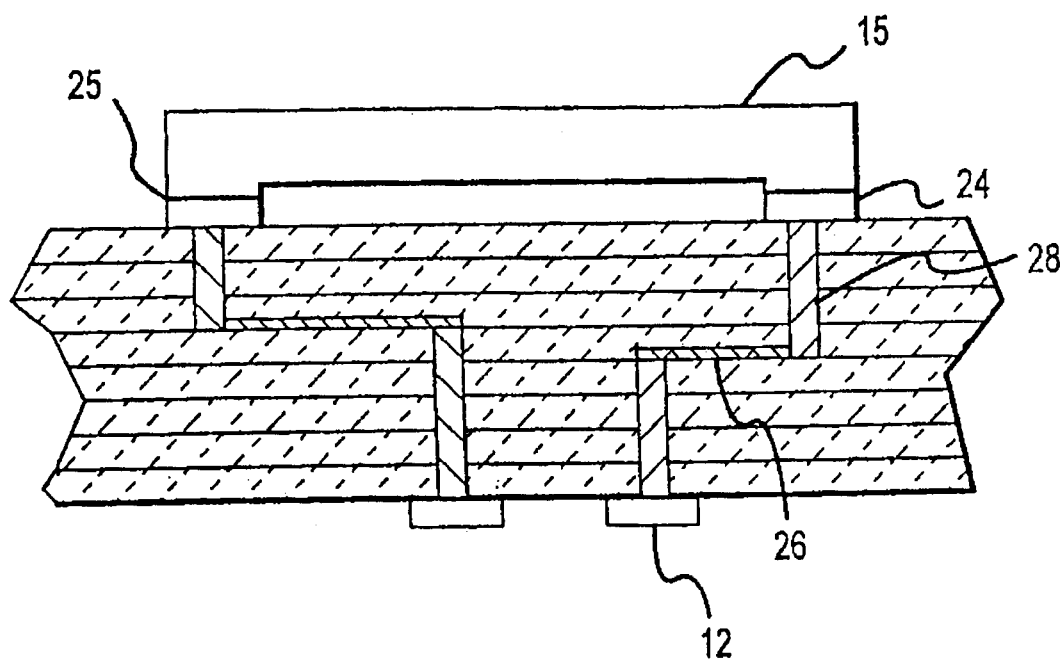
FIG. 8 is a side view of a SMA component installed on the submodule assembly.

As shown in FIG. 8, a surface mount assembly (SMA) device 15 may also be mounted on the submodule assembly. SMA device have connection pads incorporated into their body and do not require the wire bonds. In the case where surface mount assembly (SMA) type devices are to be attached to the submodule, the connection surfaces of the SMA type device are aligned with the connection pads. Once the proper alignment is made, the connections are soldered, connection 25 is created, and the attachment process is complete.

In another aspect of the invention, simple electrical components like capacitors or resistors may be silkscreened onto any of the layers in the submodule. In this case where the components are silkscreened on the upper layer, the silkscreened component is aligned with the appropriate connection pads.

Once the installation of the integrated circuit dice or other electronic devices upon the submodule assembly is complete, the submodule is then received by carrier module 6. In one aspect of the invention the carrier module has one or more cavities formed in to its structure to receive the submodule assemblies. As shown in FIG. 1, the carrier module may be designed to hold a plurality of the submodules. The submodule may be made of alumina, aluminum nitride or any such material. The cavities are milled or otherwise formed in the carrier module. The dimensions of the cavities are created to closely match the dimensions of the submodule assembly to minimize movement of the submodule assembly once positioned in the cavity. When the submodule assembly is placed in the carrier module, it is flipped so that the electronic components are facing downwards with the cavity. Facing upward are the connection pads 12. With the connection pads exposed, means are provided to connect devices on the submodule assembly to other submodules contained within the carrier or to electrical devices external from the carrier module.

Referring again to the exploded view in FIG. 1, it is seen that once the submodule 10 is installed in cavity 7, flex circuitry 4 is applied over the carrier and the submodule. Included in this flex circuitry, are conduction lines which carry signals from the submodule to other components. The flex circuit employed herein must have the flexibility to be easily removed so that the submodule assembly may be inspected.

Figure 4:
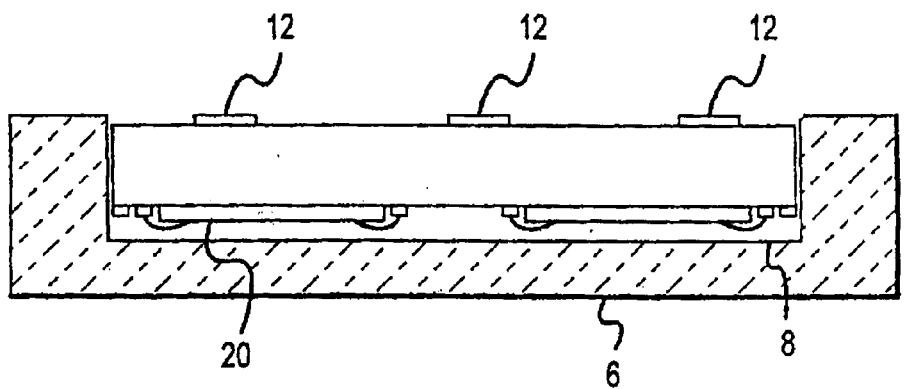
FIG. 4 is a side view of the multichip module positioned in the cavity of the carrier module.
Figure 5:
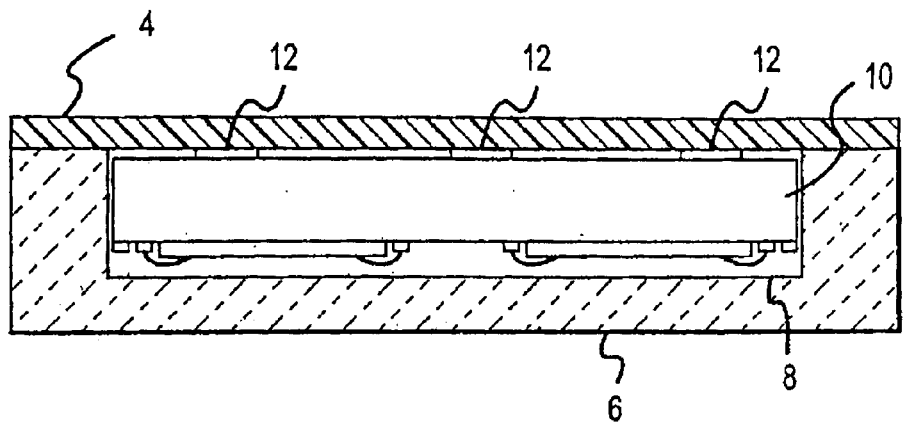
FIG. 5 shows a layer of polyimide over the submodule assembly in the cavity.
Figure 9:
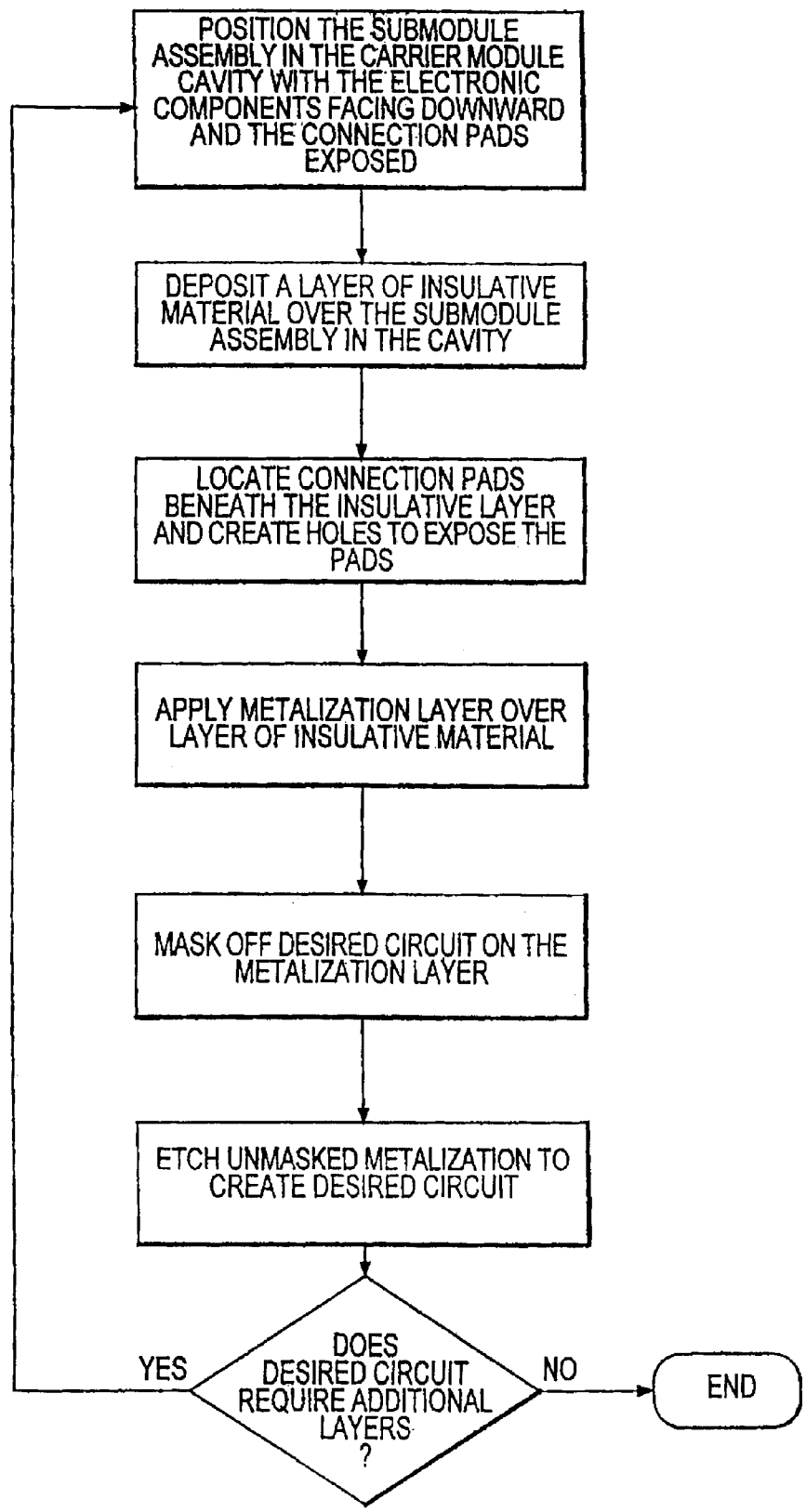
FIG. 9 is a flowchart which describes the construction of the flex circuitry.

The process for creating the flex circuitry is shown in FIGS. 4–7 and described in detail in the flowchart of FIG. 9. As was mentioned above the submodule assembly is first positioned in the cavity 7 with the connection pads 12 exposed. This is shown in FIG. 4. In order to create the flex circuitry, a layer of an insulative material is first laid over the entire upper surface of the carrier which includes the connections pads 12 of the submodule 10. This is shown in FIG. 5. The insulative layer may be polyimide or any similar material. The next step is to create holes in the insulative layer at the point where the electrical connections to the connection pads are to be made.

Figure 6:
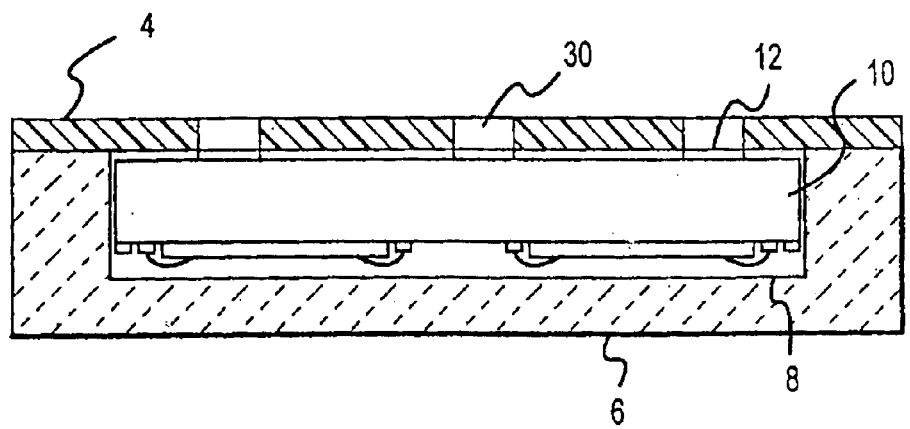
FIG. 6 shows the holes drilled through the insulative layer to expose the connection pads on the submodule assembly.

The drilling of the hole may be done manually or through an automated process. In the automated process, the location of the connection pads on the submodule are programmed into a automated drilling device. Included with the automated drilling device is an optical sensor which can locate the connection pads underneath the insulative layer within a particular range. Upon initiation of the drilling process, the drill moves to preprogrammed positions above the carrier module and locates the connection pads. If the connection pad is not located or sighted at the desired location, the automated optical sensor does a search of the surrounding area. Once the pad is located the drilling may proceed. The new location is then corrected in the programming. This drill is a high precision laser. The holes 30 are shown in FIG. 6.

Figure 7:
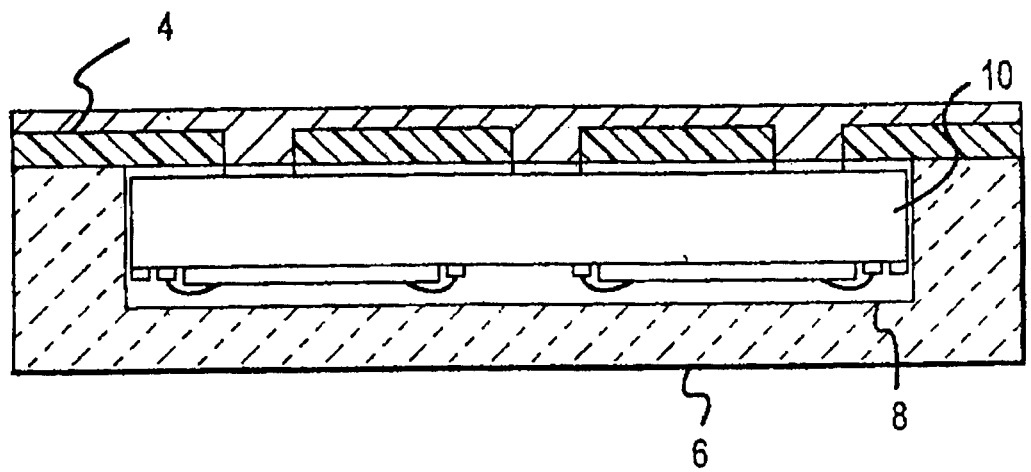
FIG. 7 shows the metallization layer disposed over the insulative layer.

Once the holes have been drilled at the connection pads, a metallization layer is deposited over the entire upper surface of the ceramic carrier. This metallization material fills in the holes 30 and establishes contact with the contact pads. Once the metallization is complete, the layer is then masked off according to a predesigned circuit which will provide electrical connections between the submodule assembly and other electronic components. The exposed metallization layer is etched leaving behind the conduction lines for the desired circuit. The metallization layer is shown in FIG. 7.

Because it may be necessary to create complex circuitry, multiple layers of the above described flex circuitry may be created. The process for constructing the additional layers is the same as described above. Another layer of the insulative material is applied to the exposed circuitry, holes are drilled, a layer of metallization is applied, and then the circuitry is etched. The insulative layer is advantageous for these complex circuits because it provides electrical insulation between the conduction lines. In addition to creating conduction lines on the insulative layer, entire metallization layers can be added in order to create ground planes or power sources.

The above-described assembly has significant advantages in that it greatly simplifies the ability to replace faulty components in the submodule assembly if one were to fail. For example, if there is an electronic element on a particular submodule which fails, the flex circuit can be peeled back from the submodule with little or no damage to the bonding pads on the LTCC, thus permitting rapid reuse if desired. Once the flex circuitry has been removed, the submodule may be lifted out of the cavity and, through use of the test interconnection pads which have been incorporated, the device can be tested to detect specifically where an error has been found. Once the error is located, the submodule can either be repaired or replaced, and then placed back in the cavity. At this point the flex circuitry can be reapplied and all necessary electrical connections reestablished.

The system described herein also offers a number of advantages during development, prototyping and rework for small build quantities and may be much more economical than a strict high density interconnect approach. A failed chip on the LTCC module can be readily replaced and reconnected. For prototyping purposes the high density interconnect module may be an open frame thus permitting ease of probing and troubleshooting right in the circuitry.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant are, within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

We claim:

1. A method of fabricating a multichip module comprising the steps of:
   (a) providing at least one submodule assembly constructed from low temperature co-fired ceramic (LTCC), where the at least one submodule assemblies includes first and second sides, where the first side has mounted thereon a plurality of circuit dice are electrically connected to at least one external electrical connection pad positionable on the second side, and the construction of the at least one submodule assembly comprises the steps:
   providing a plurality of ceramic tape layers;
   punching electrical vias through each of said plurality of ceramic tape layers;
   applying conductor and resistor inks to said plurality of ceramic tape layers, which includes the metallization of the electrical vias and creation of the external electrical connection pads on external surfaces of the at least one submodule assembly;
   pressing the layers together and firing at a predetermined temperature;
   plating the external electrical connection pads; and
   mounting the plurality of integrated circuit dice on the first side of the at least one submodule assembly proximate to a number of the external electrical connection pads on the first side of the at least one submodule assembly and establishing electrical contact between the and the at least one external electrical connection pad;
   (b) providing a carrier module configured with at least one open cavity formed therein sized to receive and support the at least one submodule assembly;
   (c) positioning the at least one submodule assembly in the at least one open cavity of the carrier module such that the first side of the submodule assembly, including the plurality of circuit dice, are substantially enclosed within the cavity and the second side, including the at least one external electrical connection pad, is exposed;
   (d) disposing at least one flexible insulative layer with upper and lower surfaces over the at least one submodule assembly and the open cavity such that the lower surface of the flexible insulative layer is in contact with the at least one submodule assembly, and the at least one submodule assembly is enclosed therein; and
   (e) locating the at least one electrical connection pad beneath the at least one flexible insulative layer and configuring the at least one flexible insulative layer such that at least one conduction line is formed over the upper surface and in connection with the at least one external electrical pad.

2. The method of claim 1 wherein a plurality of layers of the at least one insulative layer and a plurality of the metallization layers are employed to establish an electrical connection with the at least one external electrical connection pad.

3. The method of claim 1, further comprising the steps of replacing the at least one submodule assembly within the carrier module, wherein such steps comprise:
   removing the flexible insulative layer and the at least one conduction line from the carrier module;
   replacing the at least one submodule assembly with at least one new submodule assembly; and
   repeating steps (c)–(e).

4. The method of claim 1 wherein the step of locating the at least one external electrical connection pad and creating the at least one conduction hole is performed through use of an automated preprogrammed drilling device.

5. The method of claim 4 wherein a optical sensor is employed to locate the at least one external electrical pad beneath the flexible insulative layer.

6. The method of claim 1 wherein a single piece of the flexible insulative layer may be disposed over a plurality of the open cavities each with the least one submodule assembly contained therein, wherein the conduction lines disposed over the upper surface may be configured to provide electrical connections between each of the at least one submodule assemblies.

7. The method of claim 1 wherein the flexible insulative layer comprises polymide.

8. The method of claim 1, wherein the disposing and configuring the flexible electrical connection pad includes the step of:
   applying an insulating layer over the at least in one submodule and the carrier module;
   locating the at least one external electrical connection pad beneath the insulative layer and creating at least one conduction pad;
   applying a metallization layer over the insulative layer such that the metallization layer flows in the at least one conduction hole and establishes electrical contact with the at least one external electrical connection pad; and forming a predesigned circuit on the upper surface of the insulative layer by masking a portion of the metallization and etching way remaining portions of the metallization layer.

* * * * *